(12) United States Patent
Watanabe et al.

(10) Patent No.: US 10,707,373 B2
(45) Date of Patent: Jul. 7, 2020

(54) POLYCRYSTALLINE GALLIUM NITRIDE SELF-SUPPORTED SUBSTRATE AND LIGHT EMITTING ELEMENT USING SAME

(71) Applicant: NGK INSULATORS, LTD., Nagoya (JP)

(72) Inventors: Morimichi Watanabe, Nagoya (JP); Kei Sato, Nagoya (JP); Yoshitaka Kuraoka, Nagoya (JP); Katsuhiro Imai, Nagoya (JP); Tsutomu Nanataki, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/059,250

(22) Filed: Aug. 9, 2018

(65) Prior Publication Data

US 2018/0351038 A1 Dec. 6, 2018

Related U.S. Application Data

(63) Continuation of application No. PCT/JP2017/004891, filed on Feb. 10, 2017.

(30) Foreign Application Priority Data

Feb. 25, 2016 (JP) .................................. 2016-034006
Jul. 14, 2016 (JP) .................................. 2016-139508
(Continued)

(51) Int. Cl.
*H01L 33/18* (2010.01)
*C30B 9/12* (2006.01)
(Continued)

(52) U.S. Cl.
CPC ............... *H01L 33/18* (2013.01); *C30B 9/12* (2013.01); *C30B 19/02* (2013.01); *C30B 19/12* (2013.01);
(Continued)

(58) Field of Classification Search
None
See application file for complete search history.

(56) References Cited

U.S. PATENT DOCUMENTS 4,996,177 A 2/1991 Takagi et al.
5,737,178 A 4/1998 Herchen
(Continued)

FOREIGN PATENT DOCUMENTS

EP 2 886 686 A1 6/2015
JP S51-030209 A1 3/1976
(Continued)

OTHER PUBLICATIONS

International Search Report and Written Opinion (Application No. PCT/JP2016/078264) dated Nov. 1, 2016 (with English translation).
(Continued)

*Primary Examiner* — Charles D Garber
*Assistant Examiner* — Xiaoming Liu
(74) *Attorney, Agent, or Firm* — Burr & Brown, PLLC

(57) ABSTRACT

There is provided a self-supporting polycrystalline gallium nitride substrate having excellent characteristics such as high luminous efficiency and high conversion efficiency when used for devices, such as light emitting devices and solar cells. The self-supporting polycrystalline gallium nitride substrate is composed of gallium nitride-based single crystal grains having a specific crystal orientation in a direction approximately normal to the substrate, and has a top surface and a bottom surface. The crystal orientations of individual gallium nitride-based single crystal grains as determined from inverse pole figure mapping by electron backscatter diffraction (EBSD) analysis on the top surface are distributed at various tilt angles from the specific crystal orientation, in which the average tilt angle thereof is 0.1° or more and less than 1° and the cross-sectional average
(Continued)

diameter $D_T$ of the gallium nitride-based single crystal grains at the outermost surface exposed on the top surface is 10 μm or more.

13 Claims, 1 Drawing Sheet

(30) Foreign Application Priority Data

| Sep. 26, 2016 | (WO) | PCT/JP2016/078264 |
| Sep. 26, 2016 | (WO) | PCT/JP2016/078265 |
| Sep. 26, 2016 | (WO) | PCT/JP2016/078267 |

(51) Int. Cl.

| *C30B 29/40* | (2006.01) |
| *H01L 33/32* | (2010.01) |
| *H01L 31/0392* | (2006.01) |
| *C30B 28/04* | (2006.01) |
| *C30B 19/12* | (2006.01) |
| *C30B 29/60* | (2006.01) |
| *C30B 19/02* | (2006.01) |
| *H01L 33/36* | (2010.01) |

(52) U.S. Cl.
CPC ............ *C30B 28/04* (2013.01); *C30B 29/406* (2013.01); *C30B 29/605* (2013.01); *H01L 31/0392* (2013.01); *H01L 33/32* (2013.01); *H01L 33/36* (2013.01); *Y02E 10/50* (2013.01)

(56) References Cited

U.S. PATENT DOCUMENTS

| 5,754,391 | A | 5/1998 | Bates |
| 6,950,297 | B2 | 9/2005 | Kosakai |
| 2002/0011599 | A1 | 1/2002 | Motoki et al. |
| 2005/0152089 | A1 | 7/2005 | Matsuda et al. |
| 2008/0248277 | A1 | 10/2008 | Yokoyama et al. |
| 2008/0284286 | A1 | 11/2008 | Ogawa et al. |
| 2009/0170686 | A1 | 7/2009 | Yura et al. |
| 2013/0313567 | A1 | 11/2013 | Furuya et al. |
| 2015/0144956 | A1* | 5/2015 | Watanabe ............... H01L 33/32 257/76 |
| 2016/0197234 | A1* | 7/2016 | Watanabe ............... H01L 33/32 257/13 |
| 2016/0293800 | A1 | 10/2016 | Watanabe et al. |

FOREIGN PATENT DOCUMENTS

| JP | S64-033055 A1 | 2/1989 |
| JP | H05-270894 A1 | 10/1993 |
| JP | H09-172054 A1 | 6/1997 |
| JP | H11-026565 A1 | 1/1999 |
| JP | H11-310451 A1 | 11/1999 |
| JP | 2000-509552 A | 7/2000 |
| JP | 3348140 B2 | 11/2002 |
| JP | 2004-359495 A1 | 12/2004 |
| JP | 2005-210077 A1 | 8/2005 |
| JP | 2007-173679 A1 | 7/2007 |
| JP | 4008230 B2 | 11/2007 |
| JP | 2009-046376 A1 | 3/2009 |
| JP | 2010-018510 A1 | 1/2010 |
| JP | 2010-132556 A | 6/2010 |
| JP | 2010-163313 A1 | 7/2010 |
| JP | 2012-184144 A1 | 9/2012 |
| JP | 5770905 B1 | 8/2015 |
| JP | 2015-199635 A1 | 11/2015 |
| WO | 2015/093335 A1 | 6/2015 |
| WO | 2015/151902 A1 | 10/2015 |

OTHER PUBLICATIONS

International Search Report and Written Opinion (Application No. PCT/JP2016/078267) dated Nov. 1, 2016 (with English translation).
International Search Report and Written Opinion (Application No. PCT/JP2016/078265) dated Dec. 20, 2016 (with English translation).
International Search Report and Written Opinion (Application No. PCT/JP2017/004891) dated Apr. 18, 2017 (with English translation).
Extended European Search Report, European Application No. 17756243.6, dated Sep. 3, 2019 (8 pages).

* cited by examiner

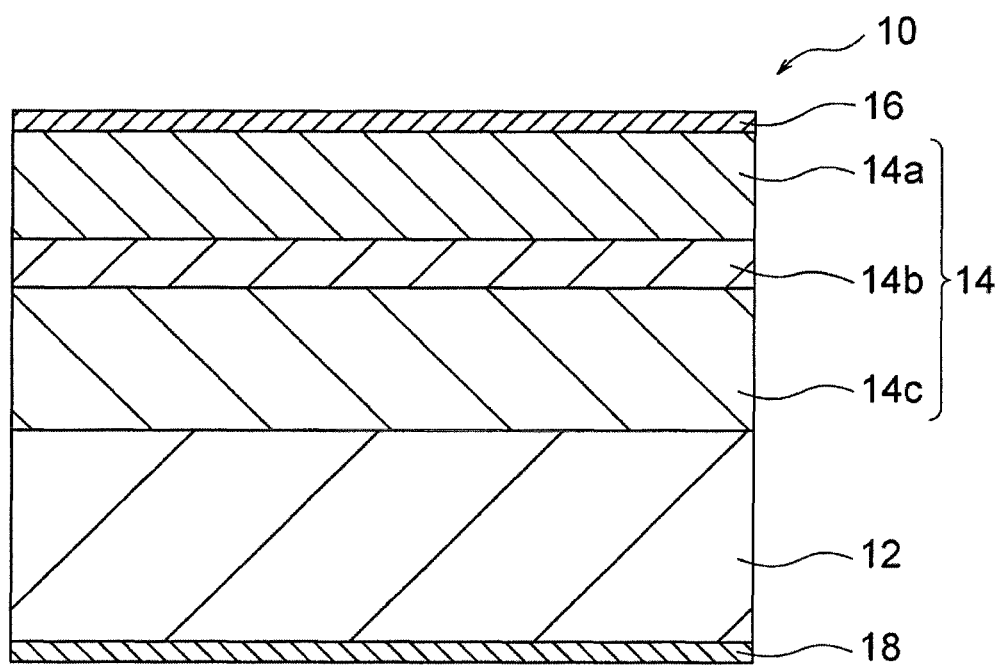

POLYCRYSTALLINE GALLIUM NITRIDE SELF-SUPPORTED SUBSTRATE AND LIGHT EMITTING ELEMENT USING SAME

CROSS-REFERENCE TO RELATED APPLICATIONS

This application is a continuation application of PCT/JP2017/004891 filed Feb. 10, 2017, which claims priority to PCT/JP2016/078264 filed Sep. 26, 2016, PCT/JP2016/078265 filed Sep. 26, 2016, PCT/JP2016/078267 filed Sep. 26, 2016, Japanese Patent Application No. 2016-139508 filed Jul. 14, 2016, and Japanese Patent Application No. 2016-034006 filed Feb. 25, 2016, the entire contents all of which are incorporated herein by reference.

BACKGROUND OF THE INVENTION

1. Field of the Invention

The present invention relates to a self-supporting polycrystalline gallium nitride substrate and a light emitting device including such a self-supporting polycrystalline gallium nitride substrate.

2. Description of the Related Art

As light emitting devices such as light emitting diodes (LEDs) including a single crystal substrate, those having various gallium nitride (GaN) layers formed on sapphire (α-alumina single crystal) are known. For example, those having a structure formed by stacking on a sapphire substrate an n-type GaN layer, a multiple quantum well (MQW) layer in which a quantum well layer composed of an InGaN layer and a barrier layer composed of a GaN layer are alternately stacked, and a p-type GaN layer in this order are in mass production. Furthermore, a multi-layer substrate suitable for such use is also proposed. For example, Patent Document 1 (JP2012-184144A) proposes a gallium nitride crystal multi-layer substrate including a sapphire base substrate and a gallium nitride crystal layer formed by crystal growth on the substrate.

When a GaN layer is formed on a sapphire substrate, dislocation is likely to occur because the lattice constant and the coefficient of thermal expansion of the GaN layer do not match with those of sapphire, which is a foreign substrate. Furthermore, since sapphire is an insulating material, an electrode cannot be formed on the surface thereof, so that it is not possible to form an electrode on its surface, and, therefore, it is not possible to configure a light emitting device having a vertical structure that includes electrodes on the front and back of the device. Accordingly, LEDs in which various gallium nitride (GaN) layers are formed on a GaN single crystal have been attracting attention. Since a GaN single crystal substrate is made of the same type of material as a GaN layer, the lattice constants and the coefficients of thermal expansion are likely to match, and higher performance can be expected than in the case where a sapphire substrate is used. For example, Patent Document 2 (JP2010-132556A) discloses a self-supporting n-type gallium nitride single crystal substrate having a thickness of 200 μm or greater.

However, single crystal substrates in general have small areas and are expensive. In particular, while there is a demand for reduction of production costs of LEDs in which large-area substrates are used, it is not easy to mass-produce large-area single crystal substrates, resulting in even higher production costs. Accordingly, an inexpensive material that can be an alternative material for single crystal substrates of gallium nitride or the like is desired. A self-supporting polycrystalline gallium nitride substrate satisfying such a requirement has been proposed. For example, Patent Document 3 (WO2015/151902A1) discloses a self-supporting polycrystalline gallium nitride substrate composed of a plurality of gallium nitride-based single crystal grains having a specific crystal orientation in a direction approximately normal to the substrate, in which the crystal orientations of individual gallium nitride-based single crystal grains as determined from inverse pole figure mapping by electron backscatter diffraction (EBSD) analysis performed on a substrate surface are distributed at various tilt angles from the specific crystal orientation, in which an average tilt angle thereof is 1 to 10°.

CITATION LIST

Patent Documents

Patent Document 1: JP2012-184144A
Patent Document 2: JP2010-132556A
Patent Document 3: WO2015/151902A1

SUMMARY OF THE INVENTION

The inventors have found that excellent properties such as high luminous efficiency and high conversion efficiency can be achieved by preparing devices, such as light emitting devices or solar cells, using the self-supporting polycrystalline gallium nitride substrate in which constituent grains have a specific crystal orientation in a direction approximately normal to the substrate such that the constituent grains are oriented at an average tilt angle of 0.1° or more and less than 1° and the cross-sectional average diameter $D_T$ at the gallium nitride-based single crystal grains is controlled to 10 μm or more. Furthermore, we have also found that high luminous efficiency can be achieved with a light emitting device including self-supporting polycrystalline gallium nitride substrate.

Accordingly, an object of the present invention is to provide a self-supporting polycrystalline gallium nitride substrate having excellent characteristics such as high luminous efficiency and high conversion efficiency in the case of being used for devices, such as light emitting devices and solar cells. Another object of the present invention is to provide light-emitting device having a high luminous efficiency using the self-supporting polycrystalline gallium nitride substrate.

According to an aspect of the present invention, there is provided a self-supporting polycrystalline gallium nitride substrate composed of a plurality of gallium nitride-based single crystal grains having a specific crystal orientation in a direction approximately normal to the substrate, wherein
the self-supporting polycrystalline gallium nitride substrate has a top surface and a bottom surface and the crystal orientations of individual gallium nitride-based single crystal grains as determined from inverse pole figure mapping by electron backscatter diffraction (EBSD) analysis performed on the top surface are distributed at various tilt angles from the specific crystal orientation, the average tilt angle thereof being 0.1° or more and less than 1° and the cross-sectional average diameter $D_T$ at the outermost surface of the gallium nitride-based single crystal grains exposed on the top surface being 10 μm or more.

According to another aspect of the present invention, there is provided a light emitting device comprising:

the self-supporting polycrystalline gallium nitride substrate according to the foregoing aspect of the present invention; and a light emitting functional layer disposed on the substrate, wherein the light emitting functional layer has at least one layer composed of a plurality of semiconductor single crystal grains, wherein the at least one layer has a single crystal structure in a direction approximately normal to the substrate.

BRIEF DESCRIPTION OF THE DRAWINGS

FIG. 1 is a schematic cross-sectional diagram illustrating an exemplary vertical light emitting device produced using the self-supporting polycrystalline gallium nitride substrate of the present invention.

DETAILED DESCRIPTION OF THE INVENTION

Self-Supporting Polycrystalline Gallium Nitride Substrate

The gallium nitride substrate of the present invention can take the form of a self-supporting substrate. In the present invention, the "self-supporting substrate" means a substrate that does not become deformed or damaged by its own weight when handled and that can be handled as solid matter. The self-supporting polycrystalline gallium nitride substrate of the present invention is usable as a substrate for various semiconductor devices such as light emitting devices, and, in addition, it is usable as a component or a layer other than a substrate, such as an electrode (which may be a p-type electrode or an n-type electrode), a p-type layer, or an n-type layer. In the following description, advantages of the present invention may be described by way of a light emitting device as an example, which is one of the principal applications, but similar or analogous advantages are also applicable to other semiconductor devices as long as such advantages are not technically contradictory.

The self-supporting polycrystalline gallium nitride substrate of the present invention is composed of a plurality of gallium nitride-based single crystal grains having a specific crystal orientation in the direction approximately normal to the substrate. The self-supporting polycrystalline gallium nitride substrate has a top surface and a bottom surface and the crystal orientations of individual gallium nitride-based single crystal grains as determined from inverse pole figure mapping by electron backscatter diffraction (EBSD) analysis performed on the top surface are distributed at various tilt angles from a specific crystal orientation (e.g., the orientation of the c-axis, a-axis, etc.), and the average tilt angle thereof is 0.1° or more and less than 1°. Furthermore, the cross-sectional average diameter $D_T$ at the outermost surface of the gallium nitride-based single crystal grains exposed on the top surface is 10 μm or more. EBSD analysis is a known technique that provides information on the crystal system and crystal orientation of a crystalline sample by irradiating the sample with an electron beam to reveal Kikuchi diffraction pattern, i.e., an EBSD pattern, resulting from electron backscatter diffraction at the sample surface. The EBSD analysis in combination with a scanning electron microscope (SEM) provides information on the crystal system and crystal orientation distribution of a microscopic region through determining and analyzing the EBSD pattern while the electron-beam is being scanned. As described above, excellent properties such as high luminous efficiency and high conversion efficiency can be achieved in the case where a device such as a light emitting device or a solar cell is manufactured using the self-supporting polycrystalline gallium nitride substrate in which constituent grains have a specific crystal orientation in the direction approximately normal to the substrate such that the constituent grains are oriented at an average tilt angle of 0.1° or more and less than 1° and the cross-sectional average diameter $D_T$ at the outermost surface of the gallium nitride-based single crystal grains is controlled to 10 μm or more. Although the reason for this is not clear, this is inferred to be attributed to the effect resulting from, for example, the light extraction efficiency. Although, as disclosed in Patent Document 3, sufficiently good characteristics can be achieved even on a self-supporting polycrystalline gallium nitride substrate having an average tilt angle of 1 to 10°, the self-supporting substrate of the present invention can provide remarkably satisfactory characteristics by controlling the average tilt angle on the top surface to be 0.1° or more and less than 1° and the cross-sectional average diameter $D_T$ at the outermost surface of the gallium nitride-based single crystal grains exposed on the top surface to be 10 μm or more. The reason for this is believed to be that the light emitting functional layer disposed on such a self-supporting substrate has a structure with a tilted orientation, thereby increasing the light extraction efficiency. Furthermore, sufficient characteristics can be achieved in the case where a semiconductor device such as a power device is manufactured using the self-supporting polycrystalline gallium nitride substrate described above.

The gallium nitride-based single crystal grains constituting the self-supporting polycrystalline gallium nitride substrate have a specific crystal orientation in the direction approximately normal to the substrate. This specific crystal orientation may be any crystal orientation (e.g., the c-plane and a-plane) that gallium nitride may have. For example, when the gallium nitride-based single crystal grains have a c-plane orientation in the direction approximately normal to the substrate, each constituent grain on the top surface of the substrate is disposed such that its c-axis extends in the direction approximately normal to the substrate (that is, the c-plane is exposed on the top surface of the substrate). While the gallium nitride-based single crystal grains constituting the self-supporting polycrystalline gallium nitride substrate have a specific crystal orientation in the direction approximately normal to the substrate, individual constituent grains are slightly tilted at various angles. That is, although the top surface of the substrate as a whole exhibits a specific crystal orientation in the direction approximately normal to the substrate, the crystal orientations of individual gallium nitride-based single crystal grains are distributed with various tilt angles from the specific crystal orientation. This unique oriented state can be assessed from inverse pole figure mapping by EBSD analysis (see, for example, FIG. 2 of Patent Document 3) performed on the top surface of the substrate (plate surface) as described above. That is, the crystal orientations of individual gallium nitride-based single crystal grains as determined from inverse pole figure mapping by EBSD analysis performed on the top surface of the substrate are distributed at various tilt angles from the specific crystal orientation, in which the average value of the tilt angles (the average tilt angle) thereof is 0.1° or more and less than 1°, preferably 0.1° or more and 0.9° or less, and more preferably 0.4° or more and 0.8° or less.

It is preferred that the self-supporting polycrystalline gallium nitride substrate have a single crystal structure in the direction approximately normal to the substrate. In this case, it can be said that the self-supporting polycrystalline gallium nitride substrate is composed of a plate composed of a plurality of gallium nitride-based single crystal grains having a single crystal structure in the direction approximately normal to the substrate. In other words, the self-supporting polycrystalline gallium nitride substrate comprises a plurality of semiconductor single crystal grains connected two-dimensionally in a horizontal plane direction, and, therefore, can have a single crystal structure in the direction approximately normal to the substrate. Accordingly, the self-supporting polycrystalline gallium nitride substrate is not a single crystal as a whole, but has a single crystal structure in terms of local domains. Such a configuration enables satisfactory characteristics to be attained in producing devices having light emitting functions and devices such as solar cells. Although the reason of this is not clear, this is considered to be the effect resulting from the translucency and light extraction efficiency of the polycrystalline gallium nitride substrate. Furthermore, the use of a gallium nitride substrate provided with electroconductivity by doping a p-type or n-type dopant can achieve a light emitting device having a vertical structure and, thereby, an increased luminance. In addition, a large-area surface light emitting device for use in surface emitting lightings or the like can be achieved at low cost. In particular, in the case where a vertical LED structure is produced using the self-supporting polycrystalline gallium nitride substrate of this embodiment, because the plurality of gallium nitride-based single crystal grains constituting the self-supporting substrate have a single crystal structure in the direction approximately normal to the substrate, highly resistive grain boundaries do not exist in electrical current paths, and as a result, preferable luminous efficiency is expected. In this regard, in the case of an oriented polycrystalline substrate in which grain boundaries exist also in the direction normal to the substrate, highly resistive grain boundaries exist in electrical current paths even when a vertical structure is formed, and thus there is a possibility of impaired luminous efficiency. From these viewpoints, the self-supporting polycrystalline gallium nitride substrate of this embodiment can be preferably used also for a vertical LED structure. Furthermore, since grain boundaries do not exist in electrical current paths, the self-supporting polycrystalline gallium nitride substrate is applicable not only to such light emitting devices but also to power devices, solar cells, etc.

Preferably, the plurality of gallium nitride-based single crystal grains constituting the self-supporting substrate has crystal orientation that is mostly aligned in the direction approximately normal to the substrate. The "crystal orientation that is mostly aligned in the direction approximately normal to the substrate" is not necessarily limited to crystal orientation that is completely aligned in the direction normal to the substrate and may be crystal orientation that is, to some extent, in alignment with the normal or a direction similar thereto if desired device properties of devices such as light emitting devices including the self-supporting substrate can be ensured. Using an expression derived from the production method, it can also be said that the gallium nitride-based single crystal grains have a structure in which grains are grown mostly in conformity with the crystal orientation of an oriented polycrystalline sintered body used as a base substrate in producing the self-supporting polycrystalline gallium nitride substrate. The "structure in which grains are grown mostly in conformity with the crystal orientation of an oriented polycrystalline sintered body" means a structure resulting from crystal growth influenced by the crystal orientation of the oriented polycrystalline sintered body, is not necessarily limited to a structure in which grains are grown completely in conformity with the crystal orientation of the oriented polycrystalline sintered body, and may be a structure in which grains are grown, to some extent, in conformity with the crystal orientation of the oriented polycrystalline sintered body as long as desired device properties of devices such as light emitting devices including the self-supporting substrate can be ensured. That is, this structure also includes a structure in which grains are grown in crystal orientation different from that of the oriented polycrystalline sintered body. In this sense, the expression "structure in which grains are grown mostly in conformity with crystal orientation" can be paraphrased as "structure in which grains are grown in a manner mostly derived from crystal orientation", and this paraphrasing and the above meaning similarly apply to similar expressions in this specification. Therefore, such crystal growth is preferably epitaxial growth, but it is not limited thereto, and may take a variety of similar crystal growth forms. In any case, with crystals grown in this way, the self-supporting polycrystalline gallium nitride substrate can have a structure, the crystal orientation of which is mostly aligned with respect to the direction approximately normal to the substrate.

Inverse pole figure mapping by electron backscatter diffraction (EBSD) analysis performed on the cross-section perpendicular to the top surface of the substrate (plate surface) of the self-supporting polycrystalline gallium nitride substrate can also confirm that the gallium nitride-based single crystal grains constituting the self-supporting substrate have a specific crystal orientation in the direction approximately normal to the substrate. However, the grains are not oriented in the direction parallel to the plate surface, which is perpendicular to the direction normal to the substrate. That is, the gallium nitride-based single crystal grains are oriented only in the direction approximately normal to the substrate, and the twist (rotation of a crystal axis) of the gallium nitride-based single crystal grains around the axis extending in the direction approximately normal to the substrate is distributed randomly. Such a structure enables satisfactory characteristics to be attained in producing devices having light emitting functions and devices such as solar cells using the self-supporting polycrystalline gallium nitride substrate. Although the reason of this is not clear, this is considered to be attributed to the effect resulting from the light extraction efficiency.

Therefore, the self-supporting polycrystalline gallium nitride substrate according to the above embodiment is observed as a single crystal when viewed in the direction normal to the substrate, and it also can be recognized as an aggregate of gallium nitride-based single crystal grains having a columnar structure in which grain boundary are observed in a view of the cross section in the horizontal plane direction of the substrate. Here, the "columnar structure" does not mean only a typical vertically long columnar shape, and is defined as having a meaning encompassing various shapes such as a horizontally long shape, a trapezoidal shape, and an inverted trapezoidal shape. As described above, the self-supporting polycrystalline gallium nitride substrate may have a structure with crystal orientation that is, to some extent, in alignment with the normal or a direction similar thereto, and does not necessarily need to have a columnar structure in a strict sense. As described above, the growth of gallium nitride single crystal grains due to the influence of the crystal orientation of an oriented polycrystalline sintered body used for production of a self-supporting polycrystalline gallium nitride substrate is considered to be the cause of the columnar structure. Therefore, the average grain diameter at the cross section (hereinafter referred to as a cross-sectional average diameter) of gallium nitride single crystal grains that can also be called columnar structures is considered to depend on not only the conditions of deposition but also the average grain diameter at the plate surface of the oriented polycrystalline sintered body. In the case where the self-supporting polycrystalline gallium nitride substrate is used as a part of a light emitting functional layer of a light emitting device, the presence of grain boundaries impairs light transmittance in the cross-sectional direction and causes light to be scattered or reflected. Therefore, in the case of a light emitting device having a structure in which light is extracted in the direction normal to the substrate, a luminance increasing effect due to scattered light from grain boundaries is also expected.

As described above, in the case where a vertical LED structure is formed using the self-supporting polycrystalline gallium nitride substrate of the present invention, it is preferable that the top surface of the self-supporting substrate on which a light emitting functional layer will be disposed and the bottom surface of the self-supporting substrate on which an electrode will be formed connect each other without intervention of grain boundaries. That is, it is preferred that the gallium nitride-based single crystal grains exposed on the top surface of the self-supporting polycrystalline gallium nitride substrate connect to the bottom surface of the self-supporting polycrystalline gallium nitride substrate without intervention of grain boundaries. The presence of a grain boundary causes resistance when electricity is applied, and therefore becomes a factor that deteriorates luminous efficiency.

The cross-sectional average diameter $D_T$ at the outermost surface of gallium nitride-based single crystal grains exposed on the top surface of the self-supporting polycrystalline gallium nitride substrate is preferably different from the cross-sectional average diameter $D_B$ at the outermost surface of the gallium nitride-based single crystal grains exposed on the bottom surface of the self-supporting polycrystalline gallium nitride substrate. In this way, the crystallinities of the self-supporting substrate and its constituent grains are enhanced. For example, when gallium nitride crystals are grown using epitaxial growth via a vapor phase or a liquid phase, growth occurs not only in the direction normal to the substrate but also in the horizontal direction, depending on the conditions of deposition. At this time, if the quality of grains that serve as a starting point of growth or of seed crystals produced thereon varies, the growth rates of respective gallium nitride crystals differ, and, fast-growing grains may grow to cover slow-growing grains. In the case of such a growth behavior, grains on the top surface side of the substrate are likely to have a larger diameter than those on the bottom surface side of the substrate. In this case, growth of slow-growing crystals terminates halfway, and a grain boundary can be observed also in the direction normal to the substrate when a certain cross section is observed. However, the grains exposed on the top surface of the substrate connect to the bottom surface of the substrate without intervention of grain boundaries, and there is not a resistive phase against application of an electric current. In other words, after gallium nitride crystals are formed into a film, the grains exposed on the top surface of the substrate (the surface opposite to the side that was in contact with the base-substrate oriented polycrystalline sintered body during production) are predominantly grains that connect to the bottom surface without intervention of grain boundaries, and therefore it is preferable to produce a light emitting functional layer on the top surface side of the substrate from the viewpoint of increasing the luminous efficiency of an LED having a vertical structure. Meanwhile, on the bottom surface side of the substrate (the surface that was in contact with the base-substrate oriented polycrystalline sintered body during production), there are also grains that do not connect to the top surface of the substrate, and thus there is a possibility of impaired luminous efficiency if a light emitting functional layer is produced on the bottom surface side of the substrate. Moreover, as described above, in the case of such a growth behavior, grains develop to have a large diameter as they grow, and therefore, the top surface of the self-supporting polycrystalline gallium nitride substrate can be paraphrased as the side on which the grain diameter of gallium nitride crystals is larger, and the bottom surface thereof can be paraphrased as the side on which the grain diameter is smaller. That is, in the self-supporting polycrystalline gallium nitride substrate, it is preferable to produce a light emitting functional layer on the side where the grain diameter of gallium nitride crystals is larger (the top surface side of the substrate) from the viewpoint of increasing the luminous efficiency of an LED having a vertical structure. When an oriented polycrystalline alumina sintered body that is oriented along the c-plane or the like is used for a base substrate, the top surface side of the self-supporting polycrystalline gallium nitride substrate (the surface opposite to the side that was in contact with the base-substrate oriented polycrystalline alumina sintered body during production) becomes the gallium surface, and the bottom surface side of the self-supporting polycrystalline gallium nitride substrate (the surface that was in contact with the base-substrate oriented polycrystalline alumina sintered body during production) becomes the nitrogen surface. That is, at the gallium surface of the self-supporting polycrystalline gallium nitride substrate, grains connecting to the bottom surface without intervention of grain boundaries are predominant. Therefore, it is preferable to produce a light emitting functional layer on the gallium surface side (the top surface side of the substrate) from the viewpoint of increasing the luminous efficiency of an LED having a vertical structure.

Therefore, in the case where grains on the top surface side of the substrate exhibit such a growth behavior that their grain diameter is larger than that of grains on the bottom surface side of the substrate, or that is to say, in the case where the cross-sectional average diameter of gallium nitride-based single crystal grains exposed on the top surface of the substrate is larger than the cross-sectional average diameter of gallium nitride-based single crystal grains exposed on the bottom surface of the substrate, luminous efficiency is increased, and therefore such diameters are preferable (this can be paraphrased that it is preferable that the number of gallium nitride-based single crystal grains exposed on the top surface of the substrate is smaller than the number of gallium nitride-based single crystal grains exposed on the bottom surface of the substrate). Specifically, the ratio $D_T/D_B$, which is the ratio of the cross-sectional average diameter at the outermost surface of gallium nitride-based single crystal grains exposed on the top surface of the self-supporting polycrystalline gallium nitride substrate (hereinafter referred to as the cross-sectional average diameter $D_T$ at the top surface of the substrate) to the cross-sectional average diameter at the outermost surface of gallium nitride-based single crystal grains exposed on the bottom surface of the self-supporting polycrystalline gallium nitride substrate (hereinafter referred to as the cross-sectional average diameter $D_B$ at the bottom surface of the substrate), is preferably greater than 1.0, more preferably 1.5 or greater, even more preferably 2.0 or greater, particularly preferably 3.0 or greater, and most preferably 5.0 or greater. However, an excessively high $D_T/D_B$ ratio may in turn result in impaired luminous efficiency, and therefore a ratio of 20 or less is preferable, and 10 or less is more preferable. Although the reason of the variation in luminous efficiency is not clear, it is considered that when the ratio $D_T/D_B$ is high, the area of grain boundaries that do not contribute to light emission is reduced due to the increased grain diameter, or crystal defects are reduced due to the increased grain diameter. Although the reason of reduction in crystal defect is not clear either, it is also considered that defective grains grow slowly, and grains with less defects grow fast. Meanwhile, when the ratio $D_T/D_B$ is excessively high, the cross-sectional diameter of grains that connect between the substrate top surface and the substrate bottom surface (i.e., grains exposed on the top surface side of the substrate) is small near the bottom surface side of the substrate. As a result, sufficient electric current paths are not obtained, which can be considered as a cause of reduction in luminous efficiency, but the details thereof are not clear.

Crystallinity at the interface between columnar structures constituting the self-supporting polycrystalline gallium nitride substrate is low, and therefore when the self-supporting polycrystalline gallium nitride substrate is used as a light emitting functional layer of a light emitting device, there is a possibility that the luminous efficiency deteriorates, the emission wavelength varies, and the emission wavelength broadens. Therefore, a larger cross-sectional average diameter of the columnar structures is preferable. In more detail, the cross-sectional average diameter $D_T$ at the outermost surface of gallium nitride-based single crystal grains exposed on the top surface of the self-supporting polycrystalline gallium nitride substrate is 10 μm or greater, preferably 20 μm or greater, more preferably 50 μm or greater, particularly preferably 70 μm or greater, and most preferably 100 μm or greater. Although the upper limit of the cross-sectional average diameter of the gallium nitride-based single crystal grains at the outermost surface (top surface) of the self-supporting polycrystalline gallium nitride substrate is not particularly limited, it is realistically 1000 μm or less, more realistically 500 μm or less, and even more realistically 200 μm or less. In order to produce gallium nitride-based single crystal grains having such a cross-sectional average diameter, it is desirable that the sintered grain diameter at the plate surface of grains that constitute the oriented polycrystalline sintered body used for producing the self-supporting polycrystalline gallium nitride substrate is 10 μm or greater, more desirably 10 μm to 1000 μm, even more desirably 10 μm to 800 μm, and particularly desirably 14 μm to 500 μm. Alternatively, with a view to making the cross-sectional average diameter of gallium nitride-based single crystal grains at the outermost surface (top surface) of the self-supporting polycrystalline gallium nitride substrate larger than the cross-sectional average diameter at the bottom surface of the self-supporting substrate, it is desirable that the sintered grain diameter at the plate surface of grains constituting the oriented polycrystalline sintered body is 10 μm to 100 μm and more desirably 14 μm to 70 μm.

The gallium nitride-based single crystal grains constituting the self-supporting polycrystalline gallium nitride substrate may be free from a dopant. Here, the phrase "free from a dopant" means that an element that is added to impart a certain function or property is not contained, but it is to be understood that incidental impurities are allowed. Alternatively, the gallium nitride-based single crystal grains constituting the self-supporting polycrystalline gallium nitride substrate may be doped with an n-type dopant or a p-type dopant, and, in this case, the self-supporting polycrystalline gallium nitride substrate can be used as a component or a layer other than a substrate, such as a p-type electrode, an n-type electrode, a p-type layer, or an n-type layer. Preferable examples of p-type dopants include one or more selected from the group consisting of beryllium (Be), magnesium (Mg), calcium (Ca), strontium (Sr), zinc (Zn), and cadmium (Cd). Preferable examples of n-type dopants include one or more selected from the group consisting of silicon (Si), germanium (Ge), tin (Sn), and oxygen (O).

The gallium nitride-based single crystal grains constituting the self-supporting polycrystalline gallium nitride substrate may be formed into a mixed crystal to control a band gap. Preferably, the gallium nitride single crystal grains may be composed of gallium nitride formed into a mixed crystal with crystals of one or more selected from the group consisting of AlN and InN, and p-type gallium nitride and/or n-type gallium nitride single crystal grains may be those in which such mixed-crystal gallium nitride is doped with a p-type dopant or an n-type dopant. For example, $Al_xGa_{1-x}N$, which is a mixed crystal of gallium nitride and AlN, can be doped with Mg to provide a p-type substrate, and $Al_xGa_{1-x}N$ can be doped with Si to provide an n-type substrate. In the case where the self-supporting substrate is used as a light emitting functional layer of a light emitting device, gallium nitride formed into a mixed crystal with AlN widens the band gap to shift the emission wavelength toward the high energy side. Furthermore, gallium nitride may be formed into a mixed crystal with InN, and this narrows the band gap to shift the emission wavelength toward the low energy side.

It is preferable that the self-supporting polycrystalline gallium nitride substrate has a size of 50.8 mm (2 inches) or greater in diameter, more preferably 100 mm (4 inches) or greater in diameter, and even more preferably 200 mm (8 inches) or greater in diameter. A larger self-supporting polycrystalline gallium nitride is preferred because it enables the number of producible devices to increase, production costs to decrease, and the area of a surface light emitting device to increase suitable for surface emitting lightings and other applications. Accordingly, the upper limits of the area and size thereof should not be specified. It is preferable that the self-supporting polycrystalline gallium nitride substrate is circular or substantially circular as viewed from above, but the shape is not limited thereto. In the case where the self-supporting gallium nitride substrate is not circular or substantially circular, the area is preferably 2026 $mm^2$ or greater, more preferably 7850 $mm^2$ or greater, and even more preferably 31400 $mm^2$ or greater. For applications that do not require a large area, the area may be smaller than the above range such as 50.8 mm (2 inches) or less in diameter, or 2026 $mm^2$ or less in terms of area. The thickness of the self-supporting polycrystalline gallium nitride substrate needs to be capable of imparting self-supporting properties to the substrate, and is thus preferably 20 μm or greater, more preferably 100 μm or greater, and even more preferably 300 μm or greater. Although the upper limit of the thickness of the self-supporting polycrystalline gallium nitride substrate should not be specified, the thickness is realistically 3000 μm or less from the viewpoint of production cost.

The aspect ratio $T/D_T$, which is defined as the ratio of the thickness T of the self-supporting polycrystalline gallium nitride substrate to the cross-sectional average diameter $D_T$ at the outermost surface of gallium nitride-based single crystal grains exposed on the top surface of the self-supporting polycrystalline gallium nitride substrate, is preferably 0.7 or greater, more preferably 1.0 or greater, and even more preferably 3.0 or greater. This aspect ratio is preferable from the viewpoint of increasing luminous efficiency in the case of LEDs. As for the cause of increased luminous efficiency, it is considered that grains with a high aspect ratio result in a low defect density in gallium nitride, increased light extraction efficiency, and so on, but details thereof are not clear.

As described so far, from the viewpoint of increasing luminous efficiency, it is preferable that (1) a light emitting functional layer is produced on the top surface side of the self-supporting substrate (the side opposite to the side that was in contact with the base-substrate oriented polycrystalline sintered body during production), (2) the ratio $D_T/D_B$, which is the ratio of the cross-sectional average diameter $D_T$ of the substrate top surface to the cross-sectional average diameter $D_B$ of the substrate bottom surface, is at a suitable value, (3) the cross-sectional average diameter at the substrate outermost surface of grains constituting the self-supporting substrate is large, and (4) the aspect ratio $T/D_T$ of grains constituting the self-supporting substrate is large. From the viewpoints (3) and (4) above, it is preferable that the cross-sectional average diameter is large and the aspect ratio is large, or in other words, a gallium nitride crystal that has a large cross-sectional average diameter on the top surface side of the substrate and a large thickness is preferable. Moreover, from the self-supporting viewpoint, the thickness of the self-supporting polycrystalline gallium nitride substrate is preferably 20 µm or greater, more preferably 100 µm or greater, and even more preferably 300 µm or greater. However, as described above, a large thickness of a gallium nitride crystal is not preferable from the cost viewpoint, and as long as the substrate is self-supporting, a lower thickness is preferable. That is, the thickness of the self-supporting polycrystalline gallium nitride substrate is realistically 3000 µm or less, preferably 600 µm or less, and preferably 300 µm or less. Therefore, the thickness is preferably about 50 to 500 µm and more preferably about 300 to 500 µm from the viewpoint of allowing the substrate to be self-supporting and increasing the luminous efficiency as well as from the viewpoint of cost.

Method for Production

The self-supporting polycrystalline gallium nitride substrate of the present invention can be produced by any method. Three preferred approaches are exemplified below. All the methods are common in terms of preparation of a polycrystalline gallium nitride layer on a base substrate composed of an oriented polycrystalline sintered body.

A first preferred approach involves deposition of a polycrystalline gallium nitride layer on an oriented polycrystalline sintered body having a small average tilt angle. That is, in the oriented polycrystalline sintered body, the orientations of individual gallium nitride-based single crystal grains as determined by inverse pole figure mapping of electron backscatter diffraction (EBSD) analysis are distributed to various tilt angles from the specific crystal orientation, and the average value of the tilt angles is small. The gallium nitride crystal can be deposited by any process, preferably by a liquid phase process, such as sodium fluxing, or a gas phase process, such as a hydride vapor phase epitaxy (HVPE). The gallium nitride grains are grown mostly in conformity with the crystal orientation of the oriented polycrystalline sintered body. Accordingly, the tilt angle of the grains in the upper surface of the oriented polycrystalline sintered body as a base substrate is controlled to 0.1° or more and less than 1°, so that the tilt angle of the resulting oriented gallium nitride crystal is controlled to be 0.1° or more and less than 1°. An oriented polycrystalline sintered body is prepared as a base substrate for preparing a self-supporting polycrystalline gallium nitride substrate. The oriented polycrystalline sintered body can have any composition. The sintered body is preferably selected from oriented polycrystalline alumina sintered bodies, oriented polycrystalline zinc oxide sintered bodies and oriented polycrystalline alumina sintered bodies, particularly preferably the oriented polycrystalline alumina sintered bodies.

A second preferred approach involves addition of impurities into a flux during the growth of the polycrystalline gallium nitride layer by Na fluxing. This can control the average tilt angle of the polycrystalline gallium nitride layer in the range of 0.1° or more and less than 1°. That is, during the growth by the Na fluxing, the gallium nitride crystals are also grown mostly in conformity with the tilt angle of the oriented polycrystalline sintered body as a base substrate. Addition of impurities in the Na flux enables the gallium nitride crystal to be grown at a reduced tilt angle of the base substrate. For example, in the case that 0.1 mol % Ca is added to Na flux to grow a gallium nitride crystal, the tilt angle of the surface of the gallium nitride crystal is reduced by 10% to 50% from the tilt angle of the upper surface of the base substrate. Since the change rate in the tilt angle during the growth of the gallium nitride crystal by the fluxing varies depending on the type and the concentration of the additive element, the combination with a base substrate having an appropriate tilt angle can achieve a gallium nitride crystal having a tilt angle of 0.1° or more and less than 1°. Although the mechanism of the tilt angle reduction is not clear, it is inferred as follows. The change rate in the tilt angle varies depending on the type of element to be added. Furthermore, the resulting gallium nitride crystal has different surface morphologies. From these facts, it is believed that the addition of a specific element can cause crystal grains having a small tilt angle to be grown at a higher rate than crystal grains having a large tilt angle, facilitating incorporation of crystal grains having a small tilt angle in the surface, eventually resulting in a reduction in overall tilt angle.

A third preferred approach involves formation of a seed crystal layer or formation of a buffer layer and a seed crystal layer on a base substrate by a gas phase approach and subsequent growth of a polycrystalline gallium nitride layer. This approach is characterized in that a seed crystal layer or a buffer layer is selectively formed only on the base substrate grains having a small tilt angle during the formation of the seed crystal layer or buffer layer. For example, a gallium nitride layer (thickness 1 to 10 µm) is formed only on alumina particles having a small tilt angle as a seed crystal layer formed on an alumina substrate, and subsequently, gallium nitride crystals are grown selectively by fluxing or HVPE to form a thick polycrystalline gallium nitride layer. In this way, the average tilt angle of the gallium nitride crystal layer can be reduced. The gallium nitride layer to function as the seed crystal layer is desirably formed by MOCVD. In particular, in order to form a gallium nitride layer to be a seed crystal layer on an oriented alumina substrate, it is preferred that a buffer layer be formed only on alumina particles having a small tilt angle and the gallium nitride layer be formed as a seed crystal layer on the buffer layer by high-temperature deposition at 1,000 to 1,150° C. It should be noted that the gallium nitride layer can be barely deposited at high temperature on alumina without the buffer layer. Preferred buffer layers include (i) an InGaN layer and (ii) a gallium nitride layer deposited at low temperature. In Case (i), InGaN layers having different indium contents can be formed depending on the tilt angles. Indium is not incorporated on grains having a large tilt angle, leading to the formation of gallium nitride having a low growth rate, whereas InGaN having a high growth rate is formed on grains having a small tilt angle. When the temperature is raised to form a high-temperature-deposited gallium nitride layer, the gallium nitride layer having a low growth rate is almost sublimated, and a high-temperature-grown gallium nitride layer (seed crystal layer) is formed only on the InGaN layer. Case (ii) is based on the finding that a low temperature gallium nitride layer on a grain having a large tilt angle is easy to sublime and a high-temperature gallium nitride layer (seed crystal layer) can be formed by utilizing this phenomenon. In any case, a high-temperature gallium nitride layer is deposited using at least one of these two buffer layers to form a seed crystal layer, on which a thick polycrystalline gallium nitride layer is deposited on the seed crystal layer by, for example, fluxing and HVPE and shaped into a substrate, resulting in an oriented gallium nitride substrate having a small average tilt angle. In Case (i) (InGaN is used as a buffer layer), it is desirable to control the indium content to be 10 mol % to 20 mol %. In this case, the buffer layer is preferably formed in a nitrogen atmosphere at a temperature of 650° C. to 850° C. In Case (ii) (low-temperature-deposited gallium nitride is used as a buffer layer), it is desirable to control the thickness of the buffer layer to 1 nm to 15 nm. In the case where the gallium nitride crystal is formed on the sapphire substrate, the thickness of the buffer layer is usually about 20 nm to 50 nm. In Case (ii), it is necessary to precisely form a thin buffer layer to partly sublime the low-temperature grown gallium nitride on the grains having a large tilt angle. In this case, it is preferred that the buffer layer be formed in a hydrogen atmosphere at a temperature of 500° C. to 550° C.

In any of the three approaches, removal of the oriented polycrystalline sintered body from the polycrystalline gallium nitride layer formed on the oriented polycrystalline sintered body can result in the self-supporting polycrystalline gallium nitride substrate. Any method can be employed to remove the oriented polycrystalline sintered body. Examples of the removal method include grinding, chemical etching, interfacial heating (laser lift-off) by laser irradiation from the side of the oriented sintered body, and spontaneous peeling utilizing difference in thermal expansion during the temperature increase.

Method for Producing Oriented Polycrystalline Sintered Body

The oriented polycrystalline sintered body used as the base substrate in the production of the self-supporting polycrystalline gallium nitride substrate of the present invention may be produced by any method for production without any particular limitation. For example, it may be produced according to the method disclosed in Patent Document 3 (WO2015/151902A1).

A method for producing an oriented polycrystalline sintered body according to a preferred embodiment of the present invention comprises the steps of: (a) preparing a stack of fine raw material powder layers and platy raw material powder layers alternately stacked, the plate surface of the platy raw material particles being oriented along the surface of the fine raw material powder layer, and (b) firing the stack, as described below.

The fine raw material powder layer used in step (a) is composed of aggregates of fine raw material particles. The fine raw material powder has an average particle diameter smaller than that of the platy raw material powder. The fine raw material powder layer may be formed by molding the fine raw material powder alone or by molding the fine raw material powder together with an additive. Examples of the additive include sintering aids, graphite, binders, plasticizers, dispersants, and dispersion media. Non-limiting examples of the molding include tape casting, extrusion molding, cast molding, injection molding, and uniaxial press molding. The fine raw material powder layer has a thickness of preferably 5 to 100 µm, more preferably 10 to 100 µm, still more preferably 20 to 60 µm.

The platy raw material powder layer used in step (a) is composed of aggregates of platy raw material particles. It is preferred that the platy raw material powder have an aspect ratio of 3 or more. The aspect ratio is defined by the ratio of the average particle diameter to the average thickness, where the average particle diameter is the average value of the long axis length of the particle plate surface and the average thickness is the average value of the short axis length of the particle. These values are determined by observing any 100 particles in the platy raw material powder with a scanning electron microscope (SEM). It is preferred that the average particle diameter of the platy raw material powder be as large as possible from the viewpoint of high orientation of the oriented sintered body, for example, preferably 1.5 µm or more, more preferably 5 µm or more, still more preferably 10 µm or more, particularly preferably 15 µm or more. From the viewpoint of densification, however, a small size, for example, 30 µm or less is preferred. Thus, it is preferred that the average particle diameter is 1.5 µm to 30 µm to achieve both high orientation and densification. The platy raw material powder layer may be formed of a platy raw material powder alone or a platy raw material powder together with an additive. Examples of the additive include sintering aids, graphite, binders, plasticizers, dispersants, and dispersion media. In the platy raw material powder layer, the plate surface of the platy raw material particles constituting the platy raw material powder is oriented along the surface of the fine raw material powder layer. The platy raw material powder is preferably in the form of single particles; otherwise, the degree of orientation and the tilt angle may decrease. In order to make the particles single, at least one of classification, disintegration, and elutriation may be employed. Preferred are to employ all these treatments. The classification and disintegration are preferably employed when agglomerates exist. Examples of the classification include air-flow classification. Examples of disintegration include pot disintegration, and wet atomization. The elutriation is preferably employed when fine powder is contained.

The stack prepared in the step (a) includes fine raw material powder layers and platy raw material powder layers alternately stacked. The stack may be prepared with single-sided workpieces in which one side of a green compact of the fine raw material powder is entirely or partially covered with a platy raw material powder layer. Alternatively, double-sided workpieces may be prepared in which two surfaces of a green compact of the fine raw material powder are covered entirely or partially with the platy raw material powder layer, and the double-sided workpieces and green compacts may be used to prepare the stack.

The single-sided workpiece or the double-sided workpiece may be produced by laminating a green compact of platy raw material powder having a thickness smaller than that of the green compact on one side or two sides of the green compact of the fine raw material powder. In this case, a green compact of platy raw material powder may be used that is formed under a shearing force by, for example, tape casting or printing to orient the plate surface of the platy raw material particle along the surface of the formed compact. Alternatively, the single-sided workpiece or the double-sided workpiece may be prepared by printing, spray coating, spin coating or dip coating of a dispersion of platy raw material powder on one side or two sides of a green compact of fine raw material powder. In spray coating, spin coating and dip coating, the plate surface of the plate-shaped raw material particles is oriented along the surface of the formed compact without intentional shearing force. Plate-shaped raw material particles oriented on the surface of the green compact may be present in a state where several platy raw material particles are overlapped, but preferably in a state where they do not overlap with other platy raw material particles.

In the case of using single-sided workpieces, single-sided workpieces may be stacked such that the fine raw material powder layers and the platy raw material powder layers are alternately stacked. In the case of using double-sided workpieces, the double-sided workpieces and the green compacts of raw material powder may be alternately stacked. Alternatively, the combination of the single-sided workpiece and the double-sided workpiece or the combination of the single-sided workpiece, the double-sided workpiece and the raw green compact also can be employed to prepare the stack.

In step (b), the stack is sintered. In this case, any sintering process can be used. Pressure sintering or hydrogen sintering is preferred. Examples of pressure sintering include hot press sintering and HIP sintering. It should be noted that normal-pressure preliminary sintering may be carried out before pressure sintering. A capsule process can also be employed for HIP sintering. In the case of hot press sintering, the pressure is preferably 50 kgf/cm$^2$ or more, more preferably 200 kgf/cm$^2$ or more. In the case of HIP sintering, the pressure is preferably 1000 kgf/cm$^2$ or more, more preferably 2000 kgf/cm$^2$ or more. Any sintering atmosphere is employed. The preferred sintering atmosphere is any one of air, nitrogen, an inert gas, such as argon, or a vacuum atmosphere, particularly preferably a nitrogen or argon atmosphere, most preferably a nitrogen atmosphere. In the stack, fine raw material powder layers, which are composed of aggregates of fine raw material particles, and platy raw material powder layers are alternately stacked, in which the plate surface of the platy raw material particles is oriented along the surface of the fine raw material powder layer. When the stack is sintered, the platy raw material particles serve as seed crystals (template), the fine raw material particles serve as a matrix, and the template is homoepitaxially grown while incorporating the matrix. Accordingly, the resulting sintered body is an oriented sintered body having a high degree of orientation and a small tilt angle. The degree of orientation and the tilt angle depend on the coverage of the platy raw material powder covering the surface of the fine raw material powder layer. In the case where the coverage is 1 to 60% (preferably 1 to 20%, more preferably 3 to 20%), the degree of orientation is high and the tilt angle is small. Furthermore, the orientation degree and the tilt angle depend on the thickness of the fine raw material powder layer. In the case where the thickness of the fine raw material powder layer is 5 to 100 μm (preferably 10 to 100 μm, more preferably 20 to 60 μm), the degree of orientation is high and the tilt angle is small. Here, the degree of orientation refers to the degree of c-plane orientation determined by the Lotgering method using an X-ray diffraction profile, and the tilt angle is represented by the XRC half-value width (XRC•FWHM).

The oriented polycrystalline sintered body can have any composition. The sintered body is preferably one selected from oriented polycrystalline alumina sintered bodies, oriented polycrystalline zinc oxide sintered bodies and oriented polycrystalline aluminum nitride sintered bodies. Accordingly, examples of the main components of the fine raw material powder and the platy raw material powder include alumina, ZnO, and AlN, preferably alumina. In the case where the main component is alumina, the sintering temperature (maximum reachable temperature) is preferably 1,850 to 2,050° C., more preferably 1,900 to 2,000° C. The term "main component" refers to a component contained in 50 mass % or more (preferably 60 mass % or more, more preferably 70 mass % or more, more preferably 80 mass % or more) of the whole powder.

The oriented sintered body prepared by the method of production of this embodiment has a high degree of c-plane orientation and a small tilt angle. For example, the c plane orientation degree can be 80% or more (preferably 90% or more, more preferably 96% or more) as determined by the Lotgering method using an X-ray diffraction profile. Furthermore, for the tilt angle, XRC•FWHM determined by the X-ray rocking curve method can be 5° or less (preferably 2.5° or less, more preferably 1.5° or less, still more preferably 1.0° or less)

Light Emitting Device and Method for Manufacturing the Same

A high-quality light emitting device can be produced using the self-supporting polycrystalline gallium nitride substrate of the present invention described above. As described above, high luminous efficiency can be achieved by constructing a light emitting device from the self-supporting polycrystalline gallium nitride substrate of the present invention. Any structure of the light emitting device including the self-supporting polycrystalline gallium nitride substrate of the present invention and any method for manufacturing the device can be employed. Typically, it is preferable that the light emitting device is produced by providing a light emitting functional layer on the self-supporting polycrystalline gallium nitride substrate, and formation of this light emitting functional layer is performed by forming at least one layer composed of a plurality of semiconductor single crystal grains, wherein the at least one layer has a single crystal structure in the direction approximately normal to the substrate so that the at least one layer has crystal orientation mostly in conformity with the crystal orientation of the gallium nitride substrate. The self-supporting polycrystalline gallium nitride substrate may be used as a component or a layer other than a base material, such as an electrode (which may be a p-type electrode or an n-type electrode), a p-type layer, an n-type layer, or the like, to produce a light emitting device. The device size is not particularly limited, and the device may be a small device having no greater than 5 mm×5 mm or may be a surface-emitting device having no less than 10 cm×10 cm.

FIG. 1 schematically shows the layer structure of a light emitting device according to one embodiment of the present invention. A light emitting device 10 shown in FIG. 1 includes a self-supporting polycrystalline gallium nitride substrate 12 and a light emitting functional layer 14 disposed on this substrate. The light emitting functional layer 14 has at least one layer composed of a plurality of semiconductor single crystal grains, wherein the at least one layer has a single crystal structure in the direction approximately normal to the substrate. This light emitting functional layer 14 emits light based on the principle of light emitting devices such as LEDs by suitably providing electrodes and the like and applying voltage. In particular, it is expected that the self-supporting polycrystalline gallium nitride substrate 12 of the present invention can also be used to provide a light emitting device having luminous efficiency equivalent to that when a gallium nitride single crystal substrate is used, and a significant cost reduction can be achieved. Moreover, a gallium nitride substrate provided with electroconductivity introduced by a p-type or n-type dopant can be used to achieve a light emitting device having a vertical structure and, thereby, an increased luminance. In addition, a large-area surface emitting device can be achieved at low cost.

The light emitting functional layer 14 is disposed on the substrate 12. The light emitting functional layer 14 may be disposed on the entire surface or a part of the substrate 12, or in the case where a buffer layer as described later is formed on the substrate 12, the light emitting functional layer 14 may be formed on the entire surface or a part of the buffer layer in the case. The light emitting functional layer 14 has at least one layer comprising a plurality of semiconductor single crystal grains wherein the at least one layer has a single crystal structure in the direction approximately normal to the substrate, and can take a variety of known layer configurations that bring about light emission based on the principle of light emitting devices represented by LEDs by suitably providing an electrode and/or a phosphor and applying voltage. Accordingly, the light emitting functional layer 14 may emit visible light such as blue or red, or may emit ultraviolet light with or without visible light. It is preferred that the light emitting functional layer 14 constitute at least part of a light emitting device that utilizes a p-n junction, and this p-n junction may include an active layer 14b between a p-type layer 14a and an n-type layer 14c as shown in FIG. 1. At this time, a double heterojunction or a single heterojunction (hereinafter collectively referred to as a heterojunction) in which a layer having a smaller band gap than the p-type layer and/or the n-type layer is used as the active layer may be used. Moreover, as one form of p-type layer/active layer/n-type layer, a quantum well structure in which the thickness of the active layer is made small can be adopted. It should be noted that, in order to achieve a quantum well, a double heterojunction should be employed in which the band gap of the active layer is made smaller than those of the p-type layer and the n-type layer. Moreover, a multiple quantum well structure (MQW) may be used in which a large number of such quantum well structures are stacked. Adopting these structures enables luminous efficiency to increase in comparison to a p-n junction. In this way, it is preferable that the light emitting functional layer 14 includes a p-n junction and/or a heterojunction and/or a quantum well junction having a light emitting function.

Therefore, the at least one layer constituting the light emitting functional layer 14 can include at least one selected from the group consisting of an n-type layer doped with an n-type dopant, a p-type layer doped with a p-type dopant, and an active layer. The n-type layer, the p-type layer, and the active layer (if present) may be composed of materials whose main components are the same or different to each other.

Any material that is grown mostly in conformity with the crystal orientation of the self-supporting polycrystalline gallium nitride substrate and has a light emitting function can be used for each layer constituting the light emitting functional layer 14, and it is preferably composed of a material whose main component is at least one selected from gallium nitride (GaN)-based materials, zinc oxide (ZnO)-based materials, and aluminum nitride (AlN)-based materials, and may suitably contain a dopant for controlling it to be a p-type or an n-type. A particularly preferable material is a gallium nitride (GaN)-based material, which is the same type of material as the self-supporting polycrystalline gallium nitride substrate. Moreover, the material constituting the light emitting functional layer 14 may be a mixed crystal in which AlN, InN, or the like forms a solid solution with GaN, for controlling the band gap thereof. Moreover, as described in the last paragraph, the light emitting functional layer 14 may be a heterojunction composed of multiple types of material systems. For example, a gallium nitride (GaN)-based material may be used for the p-type layer, and a zinc oxide (ZnO)-based material may be used for the n-type layer. Moreover, a zinc oxide (ZnO)-based material may be used for the p-type layer, a gallium nitride (GaN)-based material may be used for the active layer as well as the n-type layer, and any material combination can be employed.

The each layer constituting the light emitting functional layer 14 is composed of a plurality of semiconductor single crystal grains, wherein the layer has a single crystal structure in the direction approximately normal to the substrate. That is, each layer comprises of a plurality of semiconductor single crystal grains connected two-dimensionally in the direction of a horizontal plane, and, therefore, has a single crystal structure in the direction approximately normal to the substrate. Therefore, although each layer of the light emitting functional layer 14 is not a single crystal as a whole, it has a single crystal structure in terms of local domains, and can therefore have sufficiently high crystallinity for ensuring a light emitting function. Preferably, the semiconductor single crystal grains constituting the respective layers of the light emitting functional layer 14 have a structure in which grains are grown mostly in conformity with the crystal orientation of the self-supporting polycrystalline gallium nitride substrate, which is the substrate 12. The "structure in which grains are grown mostly in conformity with the crystal orientation of the self-supporting polycrystalline gallium nitride substrate" means a structure resulting from crystal growth influenced by the crystal orientation of the self-supporting polycrystalline gallium nitride substrate, and it is not necessarily limited to a structure in which grains are grown completely in conformity with the crystal orientation of the self-supporting polycrystalline gallium nitride substrate, and may be a structure in which grains are grown, to some extent, in conformity with the crystal orientation of the self-supporting polycrystalline gallium nitride substrate as long as a desired light emitting function can be ensured. That is, this structure also includes a structure in which grains are grown in crystal orientation different from that of the oriented polycrystalline sintered body. In this sense, the expression "structure in which grains are grown mostly in conformity with crystal orientation" can be paraphrased as "structure in which grains are grown in a manner mostly derived from crystal orientation". Therefore, such crystal growth is preferably epitaxial growth, but it is not limited thereto, and may take a variety of similar crystal growth forms. In particular, when the layers respectively constituting the n-type layer, the active layer, the p-type layer, and the like grow in the same crystal orientation as the self-supporting polycrystalline gallium nitride substrate, the structure is such that the crystal orientation from the self-supporting polycrystalline gallium nitride substrate to each layer of the light emitting functional layer is mostly aligned with respect to the direction approximately normal to the substrate, and favorable light emitting properties can be obtained. That is, when the light emitting functional layer 14 also grows mostly in conformity with the crystal orientation of the self-supporting polycrystalline gallium nitride substrate 12, the orientation is mostly uniform in the direction perpendicular to the substrate. Accordingly, a state identical to a single crystal is attained in the direction normal to the substrate. Thus, a self-supporting polycrystalline gallium nitride doped with an n-type dopant enables formation of a vertically-structured light emitting device including a cathode of the self-supporting polycrystalline gallium nitride substrate, while a self-supporting polycrystalline gallium nitride substrate doped with a p-type dopant enables formation of a vertically-structured light emitting device including an anode of the self-supporting polycrystalline gallium nitride substrate.

When at least the layers, such as the n-type layer, the active layer, and the p-type layer, constituting the light emitting functional layer 14 grow in the same crystal orientation, each layer is observed as a single crystal when viewed in the direction normal to the substrate, and thus it is also possible to recognize it as an aggregate of semiconductor single crystal grains having a columnar structure in which a grain boundary is observed when the cross section in the direction of a horizontal plane is viewed. Here, the "columnar structure" does not mean only a typical vertically long columnar shape, and is defined as having a meaning encompassing various shapes such as a horizontally long shape, a trapezoidal shape, and an inverted trapezoidal shape. As described above, each layer may have a structure in which grains are grown, to some extent, in conformity with the crystal orientation of the self-supporting polycrystalline gallium nitride substrate, and does not necessarily need to have a columnar structure in a strict sense. As described above, the growth of gallium nitride single crystal grains due to the influence of the crystal orientation of the self-supporting polycrystalline gallium nitride substrate, which is the substrate 12, is considered to be the cause of the columnar structure. Therefore, the average grain diameter at the cross section (hereinafter referred to as a cross-sectional average diameter) of semiconductor single crystal grains that can also be called columnar structures is considered to depend on not only the conditions of deposition but also the average grain diameter at the plate surface of the self-supporting polycrystalline gallium nitride substrate. The interface of columnar structures constituting the light emitting functional layer influences luminous efficiency and emission wavelength, and the presence of grain boundaries impairs light transmittance in the cross-sectional direction and causes light to be scattered or reflected. Therefore, in the case of a structure from which light is extracted in the direction normal to the substrate, a luminance increasing effect due to scattered light from grain boundaries is also expected.

Crystallinity at the interface between columnar structures constituting the light emitting functional layer 14 is low, and therefore there is a possibility that the luminous efficiency deteriorates, the emission wavelength varies, and the emission wavelength broadens. Therefore, a larger cross-sectional average diameter of the columnar structures is preferable. Preferably, the cross-sectional average diameter of the semiconductor single crystal grains at the outermost surface of the light emitting functional layer 14 is 10 μm or greater, more preferably 15 μm or greater, even more preferably 20 μm or greater, particularly preferably 50 μm or greater, and most preferably 70 μm or greater. Although the upper limit of this cross-sectional average diameter is not particularly defined, it is realistically 1000 μm or less, more realistically 500 μm or less, and even more realistically 200 μm or less. In order to produce semiconductor single crystal grains having such a cross-sectional average diameter, it is desirable that the cross-sectional average diameter at the outermost surface of the substrate of gallium nitride-based single crystal grains that constitute the self-supporting polycrystalline gallium nitride substrate is 10 μm to 1000 μm and more desirably 10 μm or greater.

In the case where a material other than a gallium nitride (GaN)-based material is partially or entirely used for the light emitting functional layer 14, a buffer layer may be provided between the self-supporting polycrystalline gallium nitride substrate 12 and the light emitting functional layer 14 for inhibiting a reaction. Such a buffer layer can contain any main component, and preferably it is composed of a material, the main component of which is at least one selected from zinc oxide (ZnO)-based materials and aluminum nitride (AlN)-based materials, and may suitably contain a dopant for controlling it to be a p-type or an n-type.

It is preferable that each layer constituting the light emitting functional layer 14 is composed of a gallium nitride-based material. For example, an n-type gallium nitride layer and a p-type gallium nitride layer may be grown in this order on the self-supporting polycrystalline gallium nitride substrate 12, or the order of stacking the p-type gallium nitride layer and the n-type gallium nitride layer may be inverse. Preferable examples of p-type dopants used for the p-type gallium nitride layer include one or more selected from the group consisting of beryllium (Be), magnesium (Mg), calcium (Ca), strontium (Sr), zinc (Zn), and cadmium (Cd). Preferable examples of n-type dopants used for the n-type gallium nitride layer include one or more selected from the group consisting of silicon (Si), germanium (Ge), tin (Sn), and oxygen (O). Moreover, the p-type gallium nitride layer and/or the n-type gallium nitride layer may be composed of gallium nitride formed into a mixed crystal with a crystal of one or more selected from the group consisting of AlN and InN, and the p-type layer and/or the n-type layer may be this mixed-crystal gallium nitride doped with a p-type dopant or an n-type dopant. For example, doping $Al_xGa_{1-x}N$, which is a mixed crystal of gallium nitride and AlN, with Mg makes it possible to provide a p-type layer, and doping $Al_xGa_{1-x}N$ with Si makes it possible to provide an n-type layer. Forming gallium nitride into a mixed crystal with AlN widens the band gap and makes it possible to shift the emission wavelength toward the high energy side. Moreover, gallium nitride may be formed into a mixed crystal with InN, and this narrows the band gap and makes it possible to shift the emission wavelength toward the low energy side. Between the p-type gallium nitride layer and the n-type gallium nitride layer, there may be an active layer composed of GaN or a mixed crystal of GaN and one or more selected from the group consisting of AlN and InN, which has a smaller band gap than both layers. The active layer has a structure that forms a double heterojunction with a p-type layer and an n-type layer, and a configuration in which this active layer is made thin corresponds to the light emitting device having a quantum well structure, which is one form of a p-n junction, and luminous efficiency can be further increased. Moreover, the active layer may be configured to have a smaller band gap than either layer and be composed of GaN or a mixed crystal of GaN and one or more selected from the group consisting of AlN and InN. Luminous efficiency can be further increased also by such a single heterojunction. The gallium nitride-based buffer layer may be composed of non-doped GaN or n-type or p-type-doped GaN, may contain AlN or InN having a close lattice constant, or may be a mixed crystal formed with GaN and one or more crystals selected from the group consisting of AlN and InN.

The light emitting functional layer 14 may be composed of a plurality of material systems selected from gallium nitride (GaN)-based materials, zinc oxide (ZnO)-based materials, and aluminum nitride (AlN)-based materials. For example, a p-type gallium nitride layer and an n-type zinc oxide layer may be grown on the self-supporting polycrystalline gallium nitride substrate 12, and the order of stacking the p-type gallium nitride layer and the n-type zinc oxide layer may be inverse. In the case where the self-supporting polycrystalline gallium nitride substrate 12 is used as a part of the light emitting functional layer 14, an n-type or p-type zinc oxide layer may be formed. Preferable examples of p-type dopants used for the p-type zinc oxide layer include one or more selected from the group consisting of nitrogen (N), phosphorus (P), arsenic (As), carbon (C), lithium (Li), sodium (Na), potassium (K), silver (Ag), and copper (Cu). Moreover, preferable examples of n-type dopants used for the n-type zinc oxide layer include one or more selected from the group consisting of aluminum (Al), gallium (Ga), indium (In), boron (B), fluorine (F), chlorine (Cl), bromine (Br), iodine (I), and silicon (Si).

Any method for forming films of the light emitting functional layer 14 and the buffer layer can be used as long as the method allows growth mostly in conformity with the crystal orientation of the self-supporting polycrystalline gallium nitride substrate, and preferable examples include vapor phase methods such as MOCVD, MBE, HVPE, and sputtering, liquid phase methods such as Na fluxing, ammonothermal method, hydrothermal method, and sol-gel method, powder methods that utilize solid phase growth of powder, and combinations of these. For example, in the case where the light emitting functional layer 14 composed of a gallium nitride-based material is produced using MOCVD, at least an organic metal gas containing gallium (Ga) (such as trimethylgallium) and a gas containing at least nitrogen (N) (such as ammonia) as raw materials may be flown over a substrate to allow growth in, for example, an atmosphere containing hydrogen, nitrogen, or both within a temperature range of about 300 to 1200° C. In this case, deposition may be performed by suitably introducing an organic metal gas containing indium (In) or aluminum (Al) for band gap control as well as silicon (Si) or magnesium (Mg) as an n-type and p-type dopant (such as trimethylindium, trimethylaluminum, monosilane, disilane, and bis-cyclopentadienylmagnesium).

Moreover, in the case where materials other than gallium nitride-based materials are used for the light emitting functional layer 14 and the buffer layer, a film of a seed crystal layer may be formed on the self-supporting polycrystalline gallium nitride substrate. Any method for forming a film of the seed crystal layer and a material are not particularly can be used as long as the method can promote crystal growth that is mostly in conformity with the crystal orientation. For example, when a zinc oxide-based material is used for a part of or all of the light emitting functional layer 14, an extremely thin zinc oxide seed crystal may be produced using a vapor phase growth method such as MOCVD, MBE, HVPE, or sputtering.

An electrode layer 16 and/or a phosphor layer may be further disposed on the light emitting functional layer 14. As described above, the light-emitting device including the conductive self-supporting polycrystalline gallium nitride substrate 12 can have a vertical structure, so that the electrode layer 18 can also be provided on the bottom surface of the self-supporting polycrystalline gallium nitride substrate 12 as shown in FIG. 1. The self-supporting polycrystalline gallium nitride substrate 12 may be used as the electrode itself, in which case it is preferred that an n-type dopant be added to the self-supporting polycrystalline gallium nitride substrate 12. The electrode layers 16 and 18 may be composed of known electrode materials. It is preferred that the electrode layer 16 on the light emitting functional layer 14 be a transparent conductive film such as ITO or a metal electrode having a high aperture ratio such as a lattice structure in that the extraction efficiency of light generated in the light-emitting function layer 14 can be increased.

In the case where the light emitting functional layer 14 can emit ultraviolet light, a phosphor layer for converting ultraviolet light into visible light may be provided on the outer side of the electrode layer. The phosphor layer may be any layer containing a known fluorescent component capable of converting ultraviolet rays into visible light. For example, preferable is such a configuration that three fluorescent components, which are excited by ultraviolet light to emit blue light, blue to green light, and red light, respectively, are allowed to be concomitantly present to obtain white light as a mixed color. Preferable combinations of such fluorescent components include $(Ca,Sr)_5(PO_4)_3Cl:Eu$, $BaMgAl_{10}O_{17}:Eu$ and Mn, and $Y_2O_3S:Eu$, and it is preferable to disperse these components in a resin such as silicone resin to form a phosphor layer. Such fluorescent components are not limited to components exemplified above, and other ultraviolet-excited phosphors such as yttrium aluminum garnet (YAG), silicate phosphors, and oxynitride-based phosphors may be combined.

Meanwhile, in the case where the light emitting functional layer 14 can emit blue light, a phosphor layer for converting blue light into yellow light may be provided on the outer side of the electrode layer. The phosphor layer may be any layer containing a known fluorescent component capable of converting blue light into yellow light. For example, it may be a combination with a phosphor that emits yellow light, such as YAG, which can provide a pseudo-white light source because blue light that has passed through the phosphor layer and yellow light from the phosphor are complementary. The phosphor layer may be configured to perform both conversion of ultraviolet light into visible light and conversion of blue light into yellow light by including both a fluorescent component that converts blue into yellow and a fluorescent component that converts ultraviolet light into visible light.

Applications

The self-supporting polycrystalline gallium nitride substrate of the present invention can be preferably used in not only the above-described light emitting device but also various applications such as various electronic devices, power devices, photodetectors, and solar cell wafers.

EXAMPLES

The present invention will now be more specifically described by way of the following examples.

Example A1: Ge-Doped Self-Supporting Gallium Nitride Substrate (1) Production of C-Plane Oriented Alumina Sintered Body
(1a) Production of Stack Mixed were 100 parts by mass of fine alumina powder (TM-DAR (average particle diameter 0.1 µm), Taimei Chemicals Co., Ltd.), 0.0125 parts by mass (125 mass ppm) of magnesium oxide (500 A, manufactured by Ube Materials Industries, Ltd.), 7.8 parts by mass of poly(vinyl butyral) (product number BM-2, manufactured by Sekisui Chemical Co., Ltd.) as a binder, 3.9 parts by mass of di-(2-ethylhexyl) phthalate (manufactured by Kurogane Kasei Co. Ltd.) as a plasticizer, 2 parts by mass of sorbitan trioleate (Rheodol SP-O30, manufactured by Kao Corporation) as a dispersant, and 2-ethylhexanol as a dispersion medium. The amount of the dispersion medium was adjusted such that the slurry viscosity was 20,000 cP. The resulting slurry was cast onto a sheet into a dry thickness of 40 μm on a PET film by doctor blading to prepare a fine alumina powder layer.

Then, commercially available flake alumina (grade YFA 10030, manufactured by Kinsei Matec Co., Ltd.) was classified with an air classifier (TC-15N manufactured by Nisshin Engineering Inc.) set at a classification point of 3 μm. The flake alumina from which the coarse particles had been removed was disintegrated in a pot pulverizer for 20 hours with cobblestones having a diameter of 0.3 mm, and finally the fine powder was removed by elutriation. A dispersion medium, i.e., 500 parts by mass of isopropyl alcohol was added to 100 parts by mass of the resulting flake alumina. The resulting dispersion (platy alumina slurry) was dispersed by an ultrasonic disperser for 5 minutes and then sprayed with a spray gun (Spray Work HG air brush wide manufactured by Tamiya Inc.) at a spray pressure of 0.2 MPa and an ejection distance of 20 cm on one side of the fine alumina powder layer to yield a single-sided workpiece. In this case, the coverage of the surface of the fine alumina powder layer covered with the flake alumina was 1%. The coverage of the single-sided workpiece was calculated as follows. The surface of the fine alumina powder layer was observed with an optical microscope. The observation photograph was subjected to image processing to separate the flake alumina and the other portions. The ratio of the area of the flake alumina to the area of the surface of the fine alumina powder layer in the observation photograph was defined as a coverage.

The resulting single-sided workpiece was cut into disks having a diameter of 60 mm, then peeled off from the PET film. Then, 65 disks were stacked so that the sprayed work surfaces did not face each other. The resulting stack was placed on an Al plate having a thickness of 10 mm and was then put in a package to evacuate the interior, resulting in a vacuum pack. This vacuum pack was subjected to isostatic pressing in hot water at 85° C. under a pressure of 100 kgf/cm$^2$ to prepare a stack.

(1b) Sintering of Stack

The resulting stack was degreased at 600° C. for 10 hours in a degreasing furnace. The degreased stack was sintered in a hot press at a sintering temperature (maximum temperature) of 1975° C. for 4 hours under a surface pressure of 200 kgf/cm$^2$ in nitrogen in a graphite mold to prepare an alumina sintered body. The press pressure was maintained during the cooling step from the sintering temperature to 1200° C., and then the press pressure was released to zero in the temperature range lower than 1200° C.

(1c) Preparation of Oriented Alumina Substrate

The sintered body prepared in this way was fixed to a ceramic surface plate and ground using a #2000 grinding wheel to planarize the plate surface. Next, the plate surface was smoothed by lapping using diamond abrasive grains to prepare an oriented alumina sintered body having a diameter of 60 mm and a thickness of 0.5 mm as an oriented alumina substrate. The flatness was improved by reducing the size of abrasive grains from 3 μm to 0.5 μm gradually. The arithmetic average roughness Ra after the process was 4 nm.

(2) Production of Ge-Doped Self-Supporting Polycrystalline Gallium Nitride Substrate (2a) Deposition of Seed Crystal Layer Next, a seed crystal layer was formed on the processed oriented alumina substrate using MOCVD. Specifically, a 30-nm thick low-temperature GaN layer as a buffer layer was deposited in a hydrogen atmosphere at a susceptor temperature of 530° C., and then the susceptor temperature was raised up to 1050° C. in a nitrogen-hydrogen atmosphere and then a GaN film having a thickness of 3 μm was deposited to produce a seed crystal substrate.

(2b) Deposition of Ge-Doped GaN Layer by Na Fluxing

The seed crystal substrate produced in the above process was placed in the bottom of a cylindrical, flat-bottomed alumina crucible having an inner diameter of 80 mm and a height of 45 mm, and then the crucible was filled with a melt composition in a glove box. The melt composition has the following ingredients:

Metal Ga: 60 g
Metal Na: 60 g
Germanium tetrachloride: 1.85 g

This alumina crucible was put in a vessel made of a refractory metal and sealed, and then placed on a rotatable rack of a crystal growth furnace. After the temperature and the pressure were increased to 870° C. and 3.5 MPa in a nitrogen atmosphere, the melt was maintained for 100 hours while being rotated and stirred, and gallium nitride crystals were allowed to grow. After the end of crystal growth, the growth vessel was cooled slowly back to room temperature for 3 hours, and then the growth vessel was taken out from the crystal growth furnace. The melt composition remaining in the crucible was removed using ethanol, and a sample in which gallium nitride crystals grew was recovered. In the resulting sample, Ge-doped gallium nitride crystals were deposited were deposited on the entire surface of the 60 mm seed crystal substrate, and the crystal thickness was about 1.4 mm. No cracks were observed.

The oriented alumina substrate portion of the sample prepared in this way was removed by grinding with grinding wheel to yield a Ge-doped gallium nitride single body. The plate surface of the Ge-doped gallium nitride crystals was polished to planarize the plate surface. Furthermore, the plate surface was smoothed by lapping and CMP to yield a Ge-doped self-supporting polycrystalline gallium nitride substrate having a thickness of about 500 μm. The self-supporting polycrystalline gallium nitride substrate after the process had an average roughness Ra of 0.2 nm.

Although an n-type semiconductor was produced by germanium doping in this example, doping may be performed using another element or doping may not be performed depending on the application and the structure.

(Evaluation of Cross-Sectional Average Diameter of Self-Supporting Polycrystalline Gallium Nitride Substrate)

In order to measure the cross-sectional average diameter of GaN single crystal grains at the outermost surface of the self-supporting polycrystalline gallium nitride substrate, an image of the top surface of the self-supporting substrate was taken with a scanning electron microscope. The visual field range was determined in such a way that when straight lines were diagonally drawn on the observed image, the straight lines crossed 10 to 30 columnar structures. The cross-sectional average grain diameter of GaN single crystal grains at the outermost surface of the self-supporting polycrystalline gallium nitride substrate was determined by diagonally drawing two straight lines on the observed image, taking the average of the line segment lengths inside all grains crossed by the straight lines, and multiplying the average by 1.5.

Moreover, as a result of measuring the cross-sectional average diameter of GaN single crystal grains at the top surface and the bottom surface of the self-supporting polycrystalline gallium nitride substrate using a method as described above, the cross-sectional average diameter at the top surface was about 140 μm, and the cross-sectional average diameter at the bottom surface was about 66 μm. In this way, the cross-sectional average diameter was larger at the top surface than the bottom surface, and $D_T/D_B$, which is the ratio of the cross-sectional average diameter $D_T$ of the substrate top surface to the cross-sectional average diameter $D_B$ of the substrate bottom surface, was about 2.1. The aspect ratio of GaN single crystal grains calculated as the ratio of the thickness T of GaN crystals to the cross-sectional average diameter $D_T$ at the top surface was about 3.6. In this example, it was possible to clearly determine the interface on the scanning microscope image of the top surface, but the above evaluation may be carried out after the process to emphasize the interface by thermal etching or chemical etching. Also, the above-described evaluation may be performed using a crystal grain map from EBSD measurement, which will be described below.

(Cross-Sectional EBSD Measurement of Gallium Nitride Crystals)

Inverse pole figure mapping of the plate surface of the self-supporting polycrystalline gallium nitride substrate was performed using an SEM (manufactured by JEOL Ltd., JSM-7000F) equipped with an electron backscatter diffraction (EBSD) system (manufactured by TSL Solutions, OIM) in a visual field of 500 μm×500 μm. This EBSD measurement was performed under the following conditions:

<EBSD Measurement Conditions>
  Accelerating voltage: 15 kV
  Irradiation beam current: $2\times10^{-8}$ A
  Working distance: 15 mm
  Step size: 2 μm
  Measurement program: OIM Data Collection The frequency distribution of tilt angles from the c-axis direction of grains constituting the outermost surface and the average tilt angle were calculated from the resulting inverse pole figure mapping. The frequency distribution of tilt angles and the average tilt angle were calculated after the image cleanup according to the Grain Dilation method using the software OIM Analysis. The cleanup conditions were as follows.

<Cleanup Conditions During EBSD Analysis>
  Grain tolerance angle: 5°
  Minimum grain size: 2 pixels The grains constituting gallium nitride crystals were oriented such that their c-planes faced to the direction normal to the substrate. The average tilt angle of the grains constituting the outermost surface was 0.9°, and the distribution appeared similar to the Gaussian distribution.

Example A2: Ge-Doped Self-Supporting Gallium Nitride Substrate (1) Production of Ge-Doped Self-Supporting Polycrystalline Gallium Nitride Substrate
(1a) Deposition of Seed Crystal Layer
An oriented $Al_2O_3$ substrate was prepared as in Example A1 except that the thickness of the buffer layer was 4 nm and a seed crystal layer was formed by the MOCVD.
(1b) Deposition of Ge-Doped GaN Layer by Na Fluxing
A Ge-doped GaN layer was formed as in Example A1 except that 0.1 g of Ca was added. In the resulting sample, Ge-doped gallium nitride crystals were deposited on the entire surface of the 60 mm seed crystal substrate, and the crystal thickness was about 1.2 mm. No cracks were observed.

The oriented alumina substrate portion of the sample prepared in this way was removed by grinding with grinding wheel to yield a Ge-doped gallium nitride single body. The plate surface of the Ge-doped gallium nitride crystals was polished to planarize the plate surface. Furthermore, the plate surface was smoothed by lapping and CMP to yield a Ge-doped self-supporting polycrystalline gallium nitride substrate having a thickness of about 500 μm. The self-supporting polycrystalline gallium nitride substrate after the process had an arithmetic average roughness Ra of 0.2 nm.

The cross-sectional average diameter of GaN single crystal grains was measured at the top surface and the bottom surface of the self-supporting polycrystalline gallium nitride substrate using the same method as Example A1. The cross-sectional average diameter was about 160 μm at the top surface and about 66 μm at the bottom surface. Accordingly, the cross-sectional average diameter was larger at the top surface than the bottom surface, and $D_T/D_B$, which is the ratio of the cross-sectional average diameter $D_T$ at the substrate top surface to the cross-sectional average diameter $D_B$ of the substrate bottom surface, was about 2.4. The aspect ratio of GaN single crystal grains calculated as the ratio of the thickness T of GaN crystals to the cross-sectional average diameter $D_T$ at the top surface was about 3.1.

As a result of performing EBSD measurement on the plate surface using the same method as Example A1, the grains constituting gallium nitride crystals were oriented such that their c-planes faced to the direction normal to the substrate, the average tilt angle of the grains constituting the outermost surface was 0.7°.

Example A3 (Comparative): Ge-Doped Self-Supporting Gallium Nitride Substrate (1) Production of C-Plane Oriented Alumina Sintered Body
(1a) Production of Stack
Mixed were 100 parts by mass of fine alumina powder (TM-DAR (average particle diameter 0.1 μm), Taimei Chemicals Co., Ltd.), 0.0125 parts by mass (125 mass ppm) of magnesium oxide (500 A, manufactured by Ube Materials Industries, Ltd.), 7.8 parts by mass of polyvinyl butyral (product number BM-2, manufactured by Sekisui Chemical Co., Ltd.) as a binder, 3.9 parts by mass of di-(2-ethylhexyl) phthalate (manufactured by Kurogane Kasei Co.) as a plasticizer, 2 parts by mass of sorbitan trioleate (Rheodol SP-O30, manufactured by Kao Corporation), and 2-ethylhexanol as a dispersion medium. The amount of the dispersion medium was adjusted such that the slurry viscosity was 20000 cP. The resulting slurry was cast onto a sheet into a dry thickness of 40 μm on a PET film by doctor blading to prepare a fine alumina powder layer.

Mixed were 100 parts by mass of flake alumina (grade YFA 10030 (average particle diameter 10 μm, average thickness 0.3 μm, aspect ratio 33), manufactured by Kinsei Matec Co., Ltd.), 50 parts by mass of polyvinyl butyral (product number BM-2, manufactured by Sekisui Chemical Co., Ltd.) as a binder, 25 parts by mass of di-(2-ethylhexyl) phthalate (manufactured by Kurogane Kasei Co.) as a plasticizer, 2 parts by mass of sorbitan trioleate (Rheodol SP-O30, manufactured by Kao Corporation), and a mixed solution of xylene and 1-butanol (mixing ratio 1:1) as a dispersion medium. The amount of the dispersion medium was adjusted such that the slurry viscosity was 5,000 cP. The resulting slurry was cast onto a sheet into a dry thickness of 3 μm on a PET film by reverse doctor blading to prepare a flake alumina layer.

Then, 50 fine alumina powder layers and 50 flake alumina layers peeled off from the PET film were stacked alternately. The resulting stack was placed on an Al plate having a thickness of 10 mm and was then put in a package to evacuate the interior, resulting in a vacuum pack. This vacuum pack was subjected to isostatic pressing in hot water at 85° C. under a pressure of 100 kgf/cm² to prepare a stack. In this case, the coverage of the surface of the fine alumina powder layer covered with the flake alumina was 60%.

(1b) Sintering of Stack

The resulting stack was degreased at 600° C. for 10 hours in a degreasing furnace. The degreased stack was sintered in a hot press at a sintering temperature (maximum temperature) of 1975° C. for 4 hours under a surface pressure of 200 kgf/cm² in nitrogen in a graphite mold to prepare an alumina sintered body. The press pressure was maintained during the cooling step from the sintering temperature to 1200° C., and then the press pressure was released to ambient pressure in the temperature range lower than 1200° C.

(1c) Preparation of Oriented Alumina Substrate

The sintered body prepared in this way was fixed to a ceramic surface plate and ground using a #2000 grinding wheel to planarize the plate surface. Next, the plate surface was smoothed by lapping using diamond abrasive grains to prepare an oriented alumina sintered body having a diameter of 60 mm and a thickness of 0.5 mm as an oriented alumina substrate. The flatness was improved by reducing the size of abrasive grains from 3 μm to 0.5 μm gradually. The arithmetic average roughness Ra after the process was 4 nm.

(2) Production of Ge-Doped Self-Supporting Polycrystalline Gallium Nitride Substrate A seed crystal layer was formed by MOCVD as in Example A1. Thereafter, a Ge-doped GaN layer was formed as in Example A1. In the resulting sample, Ge-doped gallium nitride crystals were deposited on the entire surface of the 60 mm seed crystal substrate, and the crystal thickness was about 1.3 mm. No cracks were observed.

The oriented alumina substrate portion of the sample prepared in this way was removed by grinding with grinding wheel to prepare a Ge-doped gallium nitride single body. The plate surface of the Ge-doped gallium nitride crystals was polished to planarize the plate surface. Furthermore, the plate surface was smoothed by lapping and CMP to yield a Ge-doped self-supporting polycrystalline gallium nitride substrate having a thickness of about 500 μm. The self-supporting polycrystalline gallium nitride substrate after the process had an arithmetic average roughness Ra of 0.2 nm.

The cross-sectional average diameter of GaN single crystal grains was measured at the top surface and the bottom surface of the self-supporting polycrystalline gallium nitride substrate using the same method as Example A1. The cross-sectional average diameter was about 91 μm at the top surface and about 46 μm at the bottom surface. Accordingly, the cross-sectional average diameter was larger at the top surface than the bottom surface, and $D_T/D_B$, which is the ratio of the cross-sectional average diameter $D_T$ at the substrate top surface to the cross-sectional average diameter $D_B$ of the substrate bottom surface, was about 2.0. The aspect ratio of GaN single crystal grains calculated as the ratio of the thickness T of GaN crystals to the cross-sectional average diameter $D_T$ at the top surface was about 5.5.

The EBSD measurement was performed on the plate surface using the same method as Example A1. The grains constituting gallium nitride crystals were oriented such that their c-planes faced to the direction normal to the substrate, the average tilt angle of the grains constituting the outermost surface was 2.2°.

Example A4 (Comparative): Ge-Doped Self-Supporting Gallium Nitride Substrate (1) Production of C-Plane Oriented Alumina Sintered Body Mixed were 99.6 parts by weight of a fine alumina powder (manufactured by Taimei Chemicals Co., Ltd., Grade TM-DAR), 0.2 parts by weight of a yttria powder (manufactured by Shin-Etsu Chemical Co. Ltd., Grade UU), and 0.2 parts by mass of magnesium oxide (500 A, manufactured by Ube Materials Co., Ltd.), and water was added as a solvent in a proportion of 50 cc for 100 g of the mixed powder, and the mixture was pulverized for 40 hours in a ball mill into a slurry. The resulting slurry was poured into a plaster mold having an inner diameter of 50 mm and placed in a magnetic field of 12 T for 3 hours for slip casting. The green body was taken out from the plaster mold, dried at room temperature, and then sintered for 4 hours in a hot press at 1975° C. under a surface pressure of 200 kgf/cm² in nitrogen using a graphite mold.

The sintered body prepared in this way was fixed to a ceramic surface plate and ground using a #2000 grinding wheel to planarize the plate surface. Furthermore, the surface was smoothed by lapping using diamond abrasive grains to prepare an oriented alumina sintered body, i.e., an oriented alumina substrate having a diameter of 50 mm and a thickness of 0.5 mm. The flatness was improved by reducing the size of abrasive grains from 3 μm to 0.5 μm gradually. The arithmetic average roughness Ra after the process was 4 nm.

(2) Production of Ge-Doped Self-Supporting Polycrystalline Gallium Nitride Substrate (2a) Deposition of Seed Crystal Layer Then, a seed crystal layer was formed on the processed oriented alumina substrate by MOCVD. Specifically, a 6 nm thick InGaN buffer layer was deposited in a nitrogen atmosphere at a susceptor temperature of 700° C., and then the susceptor temperature was raised up to 1050° C., and then a GaN film having a thickness of 3 μm was deposited in a nitrogen-hydrogen atmosphere to produce a seed crystal substrate. The In content in the InGaN layer was set to be 15 mol %.

(2b) Deposition of Ge-Doped GaN Layer by Na Fluxing

A Ge-doped GaN layer was formed as in Example A1 except that 0.1 g of Ca was added. In the resulting sample, Ge-doped gallium nitride crystals were grown into a thickness of about 1.2 mm on the entire surface of the 60 mm seed crystal substrate. No cracks were observed.

The oriented alumina substrate portion of the sample prepared in this way was removed with a grinding wheel to yield net Ge-doped gallium nitride. The surface of the crystalline Ge-doped gallium nitride plate was polished to planarized the plate surface. Furthermore, the plate surface was smoothed by lapping and CMP to yield a Ge-doped self-supporting polycrystalline gallium nitride substrate having a thickness of about 500 μm. The self-supporting polycrystalline gallium nitride substrate after the process had an arithmetic average roughness Ra of 0.2 nm.

The cross-sectional average diameter of GaN single crystal grains was measured at the top and bottom surfaces of the self-supporting polycrystalline gallium nitride substrate as in Example A1. The cross-sectional average diameter was about 100 μm at the top surface and about 80 μm at the bottom surface. Accordingly, the cross-sectional average diameter was larger at the top surface than the bottom surface, and $D_T/D_B$, which is the ratio of the cross-sectional average diameter $D_T$ at the substrate top surface to the cross-sectional average diameter $D_B$ of the substrate bottom surface, was about 1.3. The aspect ratio of GaN single crystal grains calculated as the ratio of the thickness T of GaN crystals to the cross-sectional average diameter $D_T$ at the top surface was about 5.0.

The EBSD measurement was performed on the plate surfaces as in Example A1. The grains constituting gallium nitride crystals were oriented such that their c-planes is directed normal to the substrate, and the average tilt angle of the grains constituting the outermost surface was 0.05°.

Example A5 (Comparative): Ge-Doped Self-Supporting Gallium Nitride Substrate (1) Production of C-Plane Oriented Alumina Sintered Body Mixed were 99.8 parts by weight of a fine alumina powder (manufactured by Taimei Chemicals Co., Ltd., Grade TM-DAR) and 0.2 parts by weight of a yttria powder (manufactured by Shin-Etsu Chemical Co. Ltd., Grade UU). Water was added as a solvent in a proportion of 50 cc for 100 g of the mixed powder, and the mixture was pulverized for 40 hours in a ball mill into a slurry. The resulting slurry was poured into a plaster mold having an inner diameter of 50 mm and placed in a magnetic field of 12 T for 3 hours for slip casting. The green body was taken out from the plaster mold, dried at room temperature, and then sintered in a hot press at 1400° C. for 4 hours under a surface pressure of 200 kgf/cm² in nitrogen using a graphite mold.

The sintered body prepared in this way was fixed to a ceramic surface plate and ground using a #2000 grinding wheel to planarize the plate surface. The plate surface was then smoothed by lapping using diamond abrasive grains to obtain an oriented alumina sintered body having a diameter of 50 mm and a thickness of 0.5 mm as an oriented alumina substrate. The flatness was improved by reducing the size of abrasive grains from 3 μm to 0.5 μm gradually. The arithmetic average roughness Ra after the process was 4 nm.

(2) Production of Ge-Doped Self-Supporting Polycrystalline Gallium Nitride Substrate A seed crystal layer was formed by MOCVD as in Example A1. A Ge-doped GaN layer was then formed as in Example A1 except that the nitrogen pressure was set to 4.0 MPa and the holding time after the heating and pressurization was set to 30 hours. In the resulting sample, Ge-doped gallium nitride crystals were deposited on the entire surface of the 50 mm seed crystal substrate, and the crystal thickness was about 0.3 mm. No cracks were observed.

The oriented alumina substrate portion of the sample prepared in this way was removed with a grinding wheel to prepare net Ge-doped gallium nitride. The plate surface of the Ge-doped gallium nitride crystals was polished to planarize the plate surface. Furthermore, the plate surface was smoothed by lapping and CMP to yield a Ge-doped self-supporting polycrystalline gallium nitride substrate having a thickness of about 70 μm. The self-supporting polycrystalline gallium nitride substrate after the process had an arithmetic average roughness Ra of 0.5 nm.

The cross-sectional average diameter of GaN single crystal grains was measured at the top surface and the bottom surface of the self-supporting polycrystalline gallium nitride substrate as in Example A1. The cross-sectional average diameter was about 9 μm at the top surface and about 8 μm at the bottom surface. Accordingly, the cross-sectional average diameter was larger at the top surface than the bottom surface, and $D_T/D_B$, which is the ratio of the cross-sectional average diameter $D_T$ at the substrate top surface to the cross-sectional average diameter $D_B$ of the substrate bottom surface, was about 1.1. The aspect ratio of GaN single crystal grains calculated as the ratio of the thickness T of GaN crystals to the cross-sectional average diameter $D_T$ at the top surface was about 7.8.

The EBSD measurement was performed on the plate surface as in Example A1. The grains constituting gallium nitride crystals were oriented such that their c-planes are directed normal to the substrate, and the average tilt angle of the grains constituting the outermost surface was 0.8°.

Example B1: Light Emitting Device Including Ge-Doped Self-Supporting Polycrystalline Gallium Nitride Substrate (1) Production of Light Emitting Device Using MOCVD, a 1 μm thick n-GaN layer doped to give a Si atom concentration of $5 \times 10^{18}$/cm³ was deposited at 1050° C. as an n-type layer on each Ge-doped self-supporting polycrystalline gallium nitride substrate produced in Examples A1 to A5. Next, a multiple quantum well layer was deposited at 750° C. as a light emitting layer. Specifically, five 2.5 nm thick InGaN well layers and six 10 nm thick GaN barrier layers were alternately stacked. Next, a 200 nm thick p-GaN doped to give a Mg atom concentration of $1 \times 10^{19}$/cm³ was deposited at 950° C. as a p-type layer. Thereafter, the sample was taken out from the MOCVD apparatus, and 800° C. heat treatment was performed for 10 minutes in a nitrogen atmosphere as activation treatment of Mg ions of the p-type layer.

Next, using photolithography and vacuum deposition, Ti/Al/Ni/Au films as a cathode were patterned on the surface on the side opposite to the n-GaN layer and the p-GaN layer of the self-supporting polycrystalline gallium nitride substrate in a thickness of 15 nm, 70 nm, 12 nm, and 60 nm, respectively. Thereafter, to improve ohmic contact characteristics, 700° C. heat treatment was performed in a nitrogen atmosphere for 30 seconds. Furthermore, using photolithography and vacuum deposition, Ni/Au films were patterned as a translucent anode on the p-type layer in a thickness of 6 nm and 12 nm, respectively. Thereafter, to improve ohmic contact characteristics, 500° C. heat treatment was performed in a nitrogen atmosphere for 30 seconds. Furthermore, using photolithography and vacuum deposition, Ni/Au films that served as an anode pad were patterned in a thickness of 5 nm and 60 nm, respectively, on a partial area of the top surface of the aforementioned Ni/Au films as a translucent anode. The wafer prepared in this way was cut into a chip and, further, furnished with a lead frame to prepare a light emitting device having a vertical structure.

(2) Evaluation of Light Emitting Device

Voltage was applied across the cathode and the anode and I-V characteristics were measured. Devices with the substrates of Examples A1 to A5, respectively, demonstrated rectifying characteristics. Furthermore, when a forward electric current flowed, light emission having a wavelength of 450 nm was confirmed. The devices with the substrates of Examples A1 and A2 had remarkably high luminance. The device with the substrate of Example A3 had acceptable luminance, but had lower luminance than those of Examples A1 and A2. The devices with the substrates of Example A4 and A5 had a significantly lower luminance than that of Example A3.

What is claimed is:
1. A self-supporting polycrystalline gallium nitride substrate composed of a plurality of gallium nitride-based single crystal grains having a specific crystal orientation in a direction approximately normal to the substrate, wherein the self-supporting polycrystalline gallium nitride substrate has a top surface and a bottom surface and the crystal orientations of individual gallium nitride-based single crystal grains as determined from inverse pole figure mapping by electron backscatter diffraction (EBSD) analysis performed on the top surface are distributed at various tilt angles from the specific crystal orientation, the average tilt angle thereof being 0.1° or more and less than 1° and the cross-sectional average diameter $D_T$ being 10 μm or more at the outermost surface of the gallium nitride-based single crystal grains exposed on the top surface.

2. The self-supporting polycrystalline gallium nitride substrate according to claim 1, wherein tilt angles of the gallium nitride-based single crystal grains have a Gaussian distribution.

3. The self-supporting polycrystalline gallium nitride substrate according to claim 1, having a single crystal structure in the direction approximately normal to the substrate.

4. The self-supporting polycrystalline gallium nitride substrate according to claim 1, wherein the gallium nitride-based single crystal grains exposed on the top surface connect to the bottom surface without intervention of grain boundaries.

5. The self-supporting polycrystalline gallium nitride substrate according to claim 1, wherein the cross-sectional average diameter $D_T$ at the outermost surface of gallium nitride-based single crystal grains exposed on the top surface is different from the cross-sectional average diameter $D_B$ at the outermost surface of the gallium nitride-based single crystal grains exposed on the bottom surface.

6. The self-supporting polycrystalline gallium nitride substrate according to claim 1, wherein a ratio $D_T/D_B$, which is the ratio of the cross-sectional average diameter $D_T$ at the outermost surface of gallium nitride-based single crystal grains exposed on the top surface to the cross-sectional average diameter $D_B$ at the outermost surface of the gallium nitride-based single crystal grains exposed on the bottom surface, is greater than 1.0.

7. The self-supporting polycrystalline gallium nitride substrate according to claim 1, having a thickness of 20 μm or more.

8. The self-supporting polycrystalline gallium nitride substrate according to claim 1, having a diameter of 50.8 mm or more.

9. The self-supporting polycrystalline gallium nitride substrate according to claim 1, wherein the gallium nitride-based single crystal grains are doped with an n-type dopant or a p-type dopant.

10. The self-supporting polycrystalline gallium nitride substrate according to claim 1, wherein the gallium nitride-based single crystal grains are free from a dopant.

11. The self-supporting polycrystalline gallium nitride substrate according to claim 1, wherein the gallium nitride-based single crystal grains comprise mixed crystals.

12. The self-supporting polycrystalline gallium nitride substrate according to claim 1, wherein the gallium nitride-based single crystal grains constituting the self-supporting polycrystalline gallium nitride substrate are crystallographically non-oriented in a direction parallel to a plate surface, which is perpendicular to the direction normal to the substrate.

13. A light emitting device comprising:
the self-supporting polycrystalline gallium nitride substrate according to claim 1; and
a light emitting functional layer disposed on the substrate, wherein the light emitting functional layer has at least one layer composed of a plurality of semiconductor single crystal grains, wherein the at least one layer has a single crystal structure in a direction approximately normal to the substrate.

\* \* \* \* \*